(12) United States Patent
Behnke et al.

(10) Patent No.: US 11,905,583 B2
(45) Date of Patent: Feb. 20, 2024

(54) GAS QUENCH FOR DIFFUSION BONDING (71) Applicant: Applied Materials, Inc., Santa Clara, CA (US)

(72) Inventors: Joseph F. Behnke, San Jose, CA (US); Joseph Frederick Sommers, San Jose, CA (US); Sumit Agarwal, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/343,482

(22) Filed: Jun. 9, 2021

(65) Prior Publication Data

US 2022/0396857 A1  Dec. 15, 2022

(51) Int. Cl.
*C22F 1/04* (2006.01)
*H01L 21/48* (2006.01)
*H01L 21/67* (2006.01)
*C22F 1/02* (2006.01)
*B23K 20/02* (2006.01)
*C22F 1/00* (2006.01)
*H01L 23/14* (2006.01)

(52) U.S. Cl.
CPC .............. *C22F 1/04* (2013.01); *B23K 20/02* (2013.01); *C22F 1/002* (2013.01); *C22F 1/02* (2013.01); *H01L 21/4878* (2013.01); *H01L 21/67092* (2013.01); *H01L 23/14* (2013.01)

(58) Field of Classification Search
None
See application file for complete search history.

(56) References Cited

U.S. PATENT DOCUMENTS

| 4,311,433 A | * | 1/1982 | Bratton | F01D 5/284 |
| | | | | 29/889.721 |
| 4,444,603 A | * | 4/1984 | Yamatsuta | C22C 49/14 |
| | | | | 428/614 |
| 4,732,312 A | | 3/1988 | Kennedy et al. | |

(Continued)

FOREIGN PATENT DOCUMENTS

| CA | 0269773 | * | 6/1988 |
| CN | 202214401 | * | 5/2012 |

(Continued)

OTHER PUBLICATIONS

ASM Handbooks. "Quenching of aluminum alloys". 2018. vol. 2A. (Year: 2018).*

(Continued)

*Primary Examiner* — Nicholas A Wang
(74) *Attorney, Agent, or Firm* — Kilpatrick Townsend & Stockton LLP (57) ABSTRACT

Exemplary methods of cooling a semiconductor component substrate may include heating the semiconductor component substrate to a temperature of greater than or about 500° C. in a chamber. The semiconductor component substrate may be or include aluminum. The methods may include delivering a gas into the chamber. The gas may be characterized by a temperature below or about 100° C. The methods may include cooling the semiconductor component substrate to a temperature below or about 200° C. in a first time period of less than or about 1 minute.

20 Claims, 3 Drawing Sheets

(56) References Cited

U.S. PATENT DOCUMENTS

| | | | |
|---|---|---|---|
| 6,274,015 B1 * | 8/2001 | Beier | C23C 14/3407 |
| | | | 148/415 |
| 2007/0210037 A1 | 9/2007 | Ishida et al. | |
| 2016/0168676 A1 | 6/2016 | Luckey, Jr. et al. | |

FOREIGN PATENT DOCUMENTS

| | | | |
|---|---|---|---|
| EP | 2909351 B1 | | 2/2017 |
| JP | 2020-012191 A | | 1/2020 |
| JP | 2020012191 | * | 1/2020 |

OTHER PUBLICATIONS

ASM Handbooks. "Heat treating of nonferrous alloys". 1998. (Year: 1998).*

Ding, Y. "Study on residual stress and mechanical behavior of intermetallic compound layer in diffusion bonding of Mg/Al alloy." 2018. Saitama Institute technology. (Year: 2018).*

International Search Report and Written Opinion dated Sep. 13, 2022 in International Patent Application No. PCT/US2022/029981, 10 pages.

* cited by examiner

GAS QUENCH FOR DIFFUSION BONDING

TECHNICAL FIELD

The present technology relates to processes and systems for diffusion bonding. More specifically, the present technology relates to systems and methods for cooling a substrate after diffusion bonding operations.

BACKGROUND

Semiconductor processing systems may include a number of components used to support substrates, deliver formation and removal materials, and define processing regions and flow paths. These components may be exposed to high and low temperatures, high and low pressures, and a variety of corrosive and erosive materials. Accordingly, many processing chambers include treated or coated materials. However, as processing systems and chambers become more complex, the components incorporated within the system may become multi-piece apparatuses that must be joined or bonded in one or more ways. These joints and seams may similarly be exposed to environmental conditions and materials that can cause damage to the components.

Thus, there is a need for improved systems and components that can be used to produce high quality devices and structures. These and other needs are addressed by the present technology.

SUMMARY

Exemplary methods of cooling a semiconductor component substrate may include heating the semiconductor component substrate to a temperature of greater than or about 500° C. in a chamber. The semiconductor component substrate may be or include aluminum. The methods may include delivering a gas into the chamber. The gas may be characterized by a temperature below or about 100° C. The methods may include cooling the semiconductor component substrate to a temperature below or about 200° C. in a first time period of less than or about 1 minute.

In some embodiments, the semiconductor component substrate may be or include aluminum 6061. Subsequent the cooling, the semiconductor component substrate may be characterized by a Vicker's hardness of greater than or about 100. The methods may include maintaining the semiconductor component substrate at a temperature between about 150° C. and about 200° C. for a second time period of greater than or about 1 hours. The methods may include, subsequent to the second time period, air cooling the semiconductor component substrate. The semiconductor component substrate may be or include a diffusion bonded aluminum substrate. The diffusion bonded aluminum substrate may define one or more internal channels accessible through aperture defined in the diffusion bonded aluminum substrate. The gas may be air, water vapor, nitrogen, or argon. The chamber may include a heater and a support for the semiconductor component substrate. A plurality of gas apertures may be defined about the support. The chamber may be a diffusion bonding chamber.

Some embodiments of the present technology may encompass methods of cooling a semiconductor component substrate. The methods may include heating the semiconductor component substrate to a temperature of greater than or about 500° C. in a diffusion bonding chamber while applying a uniaxial force against the semiconductor component substrate. The semiconductor component substrate may include a first aluminum piece and a second aluminum piece. The methods may include delivering a gas into the diffusion bonding chamber. The gas may be characterized by a temperature below or about 100° C. The methods may include cooling the semiconductor component substrate to a temperature below or about 200° C. in a first time period of less than or about 1 minute.

In some embodiments, the methods may include maintaining the semiconductor component substrate at a temperature between about 150° C. and about 200° C. for a second time period of greater than or about 1 hours. The methods may include, subsequent to the second time period, air cooling the semiconductor component substrate. The diffusion bonding chamber may include a heater, a support for the semiconductor component substrate, and a mechanical press. A plurality of gas apertures may be defined about the support. The diffusion bonding chamber may include an exhaust system configured to maintain fluid flow through the diffusion bonding chamber while delivering a gas into the diffusion bonding chamber. The first aluminum piece may define one or more channels, and the second aluminum piece may define one or more apertures. Each of the first aluminum piece and the second aluminum piece may be or include aluminum 6061. Subsequent the cooling, the semiconductor component substrate may be characterized by a Vicker's hardness of greater than or about 65. The methods may include adjusting the uniaxial force being applied against the semiconductor component substrate while cooling the semiconductor component substrate.

Some embodiments of the present technology may encompass diffusion bonding systems. The systems may include a chamber. The chamber may include chamber sidewalls. The chamber sidewalls may define a plurality of gas apertures. The chamber may include a substrate support. The chamber may include a heater. The chamber may include a mechanical press. The systems may include a gas delivery system. The gas delivery system may be fluidly coupled with the plurality of gas apertures defined in the chamber sidewalls. The systems may include an exhaust system. The diffusion bonding system may be configured to perform an air quench to a component disposed within the chamber.

Such technology may provide numerous benefits over conventional systems and techniques. For example, the present technology may form semiconductor system components characterized by improved material properties compared to conventional technologies. Additionally, the present technology may reduce post-bonding processing to restore material properties for bonded components. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Semiconductor processing utilizes systems configured to produce environmental conditions to facilitate semiconductor fabrication, and systems that include a number of complex components to support or facilitate substrate processing. Because of the environment in which semiconductor processing may be performed, many components within a processing chamber may be made from or include aluminum or aluminum alloys. Many of these components include multiple pieces bonded together to produce channels, flow paths, or sealed regions within the component. The bonds may be formed in any number of ways, and in some processes, diffusion bonding is performed to essentially produce single-component parts that may be characterized by any number of internal features.

Diffusion bonding may be performed in any number of ways, and may generally include heating components to a temperature allowing a solid solution between the components to form at the interface, and applying pressure to the components to produce a single component. However, many of the base materials used as the pieces to be bonded together may be characterized by material properties that can be affected by the bonding process. For example, an exemplary material encompassed by the present technology may be aluminum 6061, which may be an aluminum alloy formed by precipitation hardening. The general process for producing each component may include heating the alloy materials to a relatively high temperature for a period of time, which may produce a solid solution of all incorporated elements. This may be followed by placing the component in a bath to quench or rapidly cool the component, which can induce certain material properties to occur. The quench bath may be an aqueous bath, or may include oil or brine, for example. The rapid cooling may cause material stresses, and thus, to alleviate stress and enhance material properties, an aging process may be performed subsequent to the quench, where the component is re-heated for a period of time. This may allow precipitates to form, such as magnesium and silicon materials for aluminum 6061, which may then diffuse through the component and improve the mechanical properties. This can produce tempering, such as T4 or T6 temper, which can increase strength and hardness of the material.

However, when a diffusion bonding process is subsequently performed with two or more precipitation hardened materials, the process may include application of temperatures even higher than during heat treatment. Additionally, diffusion bonding chambers typically must perform slow cooling to control stress and protect the chamber components of the diffusion bonding chamber. Hence, this may revert the components to an O temper, with much reduced material properties, as solutionizing may re-occur, but tempering operations may not be performed. The result for conventional technologies is either that the final component produced may be limited in mechanical properties, or subsequent to the bonding, the heat treatment may be performed an additional time, which may further strain material properties of the material, and lower ultimate strength and hardness.

An additional issue with repeating the tempering process is that conventional technologies use a fluid bath for the quench. This may contaminate many semiconductor processing system components. As one non-limiting example, diffusion-bonded materials may be incorporated into semiconductor supports, which may define a number of channels, such as for backside gas flow, where a gas is delivered through the support and along a backside of the substrate to limit contaminant ingression into the substrate support. A fluid quenching operation may allow any number of contaminants to infiltrate the component channels and recesses, which may not be fully removed prior to installation. When gas is flowed through the component, these contaminants may be dislodged and delivered into the processing region, which can cause contamination and yield loss.

The present technology overcomes these issues by performing a gas quench process on components after diffusion bonding. Whether after repeating a heat treatment subsequent to diffusion bonding, or in a diffusion bonding chamber in which a gas quench may be employed, the present technology may provide improved material properties and reduced component contamination compared to conventional technologies. Accordingly, in some embodiments of the present technology reduced material strain may occur, and post processing may be reduced. Although the remaining disclosure will routinely identify specific materials and components utilizing aspects of the disclosed technology, it will be readily understood that the systems, methods, and materials are equally applicable to a variety of other devices and processes as may occur in semiconductor processing systems, or in other fabrication in which bonding may be performed. Accordingly, the technology should not be considered to be so limited as for use with the described components and processes alone. The disclosure will discuss non-limiting operations of exemplary processes and exemplary chamber systems that may be used according to embodiments of the present technology.

Figure 1:
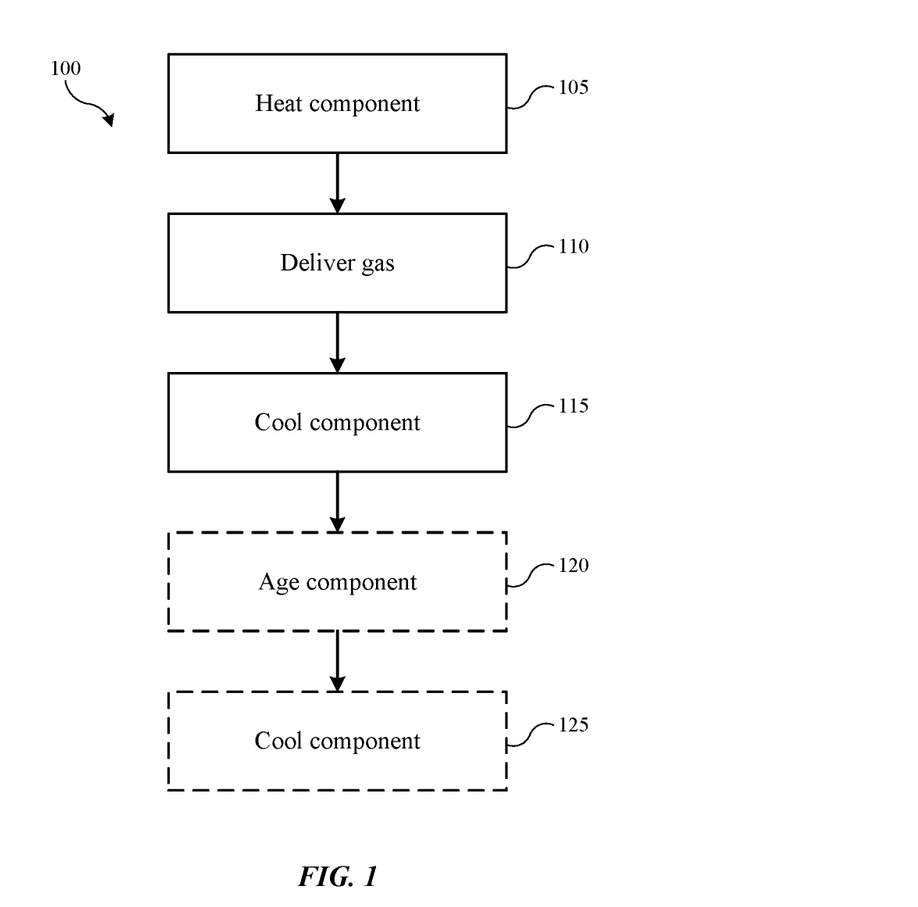
FIG. 1 shows selected operations in a method of cooling a component according to some embodiments of the present technology.

Turning to FIG. 1 is shown selected operations in a method 100 of performing a gas cool or quench of semiconductor component substrates according to some embodiments of the present technology. Many operations of method 100 may be performed, for example, in any number of chambers or systems, including diffusion bonding chambers as further described below, as well as any combination of systems discussed, or which may be configured to perform operations as discussed for method 100. Method 100 may include one or more operations prior to the initiation of the method, including processing to produce or prepare one or more parts or pieces which may be bonded, as well as components that have been bonded already. For example, upstream processing may include casting or treating metal components, as well as bonding two or more components together. The method may include a number of optional operations as denoted in the figure, which may or may not be specifically associated with the method according to the present technology. For example, many of the operations are described in order to provide a broader scope of the structural formation, but are not critical to the technology, or may be performed by alternative methodology as will be discussed further below.

As discussed throughout the present disclosure, substrates according to embodiments of the present technology may be or include any number of components or component sections. For example, exemplary component substrates in semiconductor processing systems may include any component incorporated in a semiconductor processing system that may include materials produced by diffusion or other bonding techniques. For example, substrate support components, fluid delivery components, such as showerheads or lid plates, structural components, such as spacers or liners, as well as any other multi-piece component that may be bonded to produce a channel, feature, or to embed a component may be encompassed as substrates according to embodiments of the present technology. The components may be made of any number of materials, which may be or include aluminum, carbon, chromium, copper, iron, magnesium, manganese, nickel, silicon, titanium, or zinc. The components may be or include alloys, such as aluminum alloys, which may include any number of materials. Exemplary alloys may include any known aluminum alloy, including alloys from the 1xxx series, the 2xxx series, the 3xxx series, the 4xxx series, the 5xxx series, the 6xxx series, or the 7xxx series. Although the discussion below may regularly reference aluminum 6061, it is to be understood that the present technology may be employed with any aluminum alloy, as well as alloys of any number of other metals.

Method 100 may include heating the substrate at operation 105, such as a semiconductor processing system component, to a temperature of greater than or about 400° C. in a chamber, and which may be heated to a temperature of greater than or about 420° C., greater than or about 440° C., greater than or about 460° C., greater than or about 480° C., greater than or about 500° C., greater than or about 520° C., greater than or about 540° C., greater than or about 560° C., greater than or about 580° C., greater than or about 600° C., or more, depending on the material being used. As noted above, chambers utilized in embodiments according to the present technology may include diffusion bonding chambers, as well as treatment chambers, which may include a heater and a gas delivery system, which may allow each of the processes of method 100 to be performed. The component may be maintained at any of the temperature ranges noted above for a period of time that may be greater than or about 1 hour, and may be greater than or about 2 hours, greater than or about 3 hours, greater than or about 4 hours, greater than or about 5 hours, or more, such as during a precipitation hardening operation. As will be explained further below, the time at elevated temperature may also be less in some embodiments, such as during a diffusion bonding operation.

After the period of time at elevated temperature, method 100 may include delivering a gas into the chamber at operation 110. The gas may be flowed about the component, and may cause the component to be cooled at operation 115. The gas flow and cooling may be performed to ensure the component is cooled at a rate sufficient to improve material properties. For example, the temperature and flow rate of the gas flow may be modulated to improve cooling, which may allow the component to be cooled below a threshold temperature within a period of time. A temperature of the gas being delivered may be controlled to ensure the component cools at an adequate rate. For example, in some embodiments the gas may be delivered at a temperature that is less than or about 100° C., and may be delivered at a temperature that is less than or about 95° C., less than or about 90° C., less than or about 85° C., less than or about 80° C., less than or about 75° C., less than or about 70° C., less than or about 65° C., less than or about 60° C., less than or about 55° C., less than or about 50° C., less than or about 45° C., less than or about 40° C., less than or about 35° C., less than or about 30° C., less than or about 25° C., less than or about 20° C., less than or about 15° C., less than or about 10° C., less than or about 5° C., less than or about 0° C., or less, although the temperature may be maintained above or about 0° C., or more, to limit stress induced by the rapid cooling.

The flow rate at which the gas may be delivered may vary over a wide range, which may be affected by the chamber size and configuration, the component size, the rate of cooling, the temperature of the gas being delivered, among other variables, and thus the gas may be delivered at a rate of from less than or about 100 sccm up to flow rates of dozens of slm, or more. By performing the gas delivery, the temperature of the component may be reduced at a rate of greater than or about 50° C./min, and may be reduced at a rate of greater than or about 100° C./min, greater than or about 150° C./min, greater than or about 200° C./min, greater than or about 250° C./min, greater than or about 300° C./min, greater than or about 350° C./min, greater than or about 400° C./min, greater than or about 450° C./min, greater than or about 500° C./min, greater than or about 550° C./min, greater than or about 600° C./min, greater than or about 650° C./min, greater than or about 700° C./min, greater than or about 750° C./min, greater than or about 800° C./min, greater than or about 850° C./min, greater than or about 900° C./min, greater than or about 950° C./min, greater than or about 1000° C./min, or more. Consequently, the period of time during which the component is cooled may be less than or about 1 minute, and may be less than or about 55 seconds, less than or about 50 seconds, less than or about 45 seconds, less than or about 40 seconds, less than or about 35 seconds, less than or about 30 seconds, less than or about 25 seconds, less than or about 20 seconds, less than or about 15 seconds, less than or about 10 seconds, less than or about 5 seconds, or less.

The component may be cooled below any threshold temperature, such as being cooled to a temperature less than or about 400° C., and the component may be cooled to a temperature of less than or about 350° C., less than or about 300° C., less than or about 250° C., less than or about 200° C., less than or about 190° C., less than or about 180° C., less than or about 170° C., less than or about 160° C., less than or about 150° C., less than or about 140° C., less than or about 130° C., less than or about 120° C., less than or about 110° C., less than or about 100° C., less than or about 90° C., less than or about 80° C., less than or about 70° C., less than or about 60° C., less than or about 50° C., or less. In some embodiments the component may then be aged at optional operation 120 for a second period of time. The aging process may include reheating the component to an aging temperature, which may be any temperature noted above, although in some embodiments the quenching process may be performed to reduce the component temperature only to the aging temperature. As one non-limiting example, the component may be cooled only to a temperature of between about 100° C. and about 200° C., or reheated back to this temperature range, and maintained at this temperature for a period of time to induce aging as previously described. In some embodiments, the method may then include cooling the component, either by gas, liquid, or simply air-cooling, at optional operation 125. The aging process may be performed for any time period noted previously, and may be performed for several hours in some embodiments.

As noted above, the present technology may perform the quenching operation by delivering one or more gases or vapors, which may limit contamination of the component. Because components according to some embodiments may include complex channel configurations and limited aperture access, utilizing a gas flow may control ingress of contaminants that may later be ejected in processing chambers. For example, encompassed components may include components incorporated in a substrate support. Some components may define trenches or channels that may seat components, such as heaters, or may define a path for fluid delivery, such as gases, which may be expelled through apertures defined in a surface of the components. Gases encompassed by the present technology may include air, although in some embodiments the gases may not limit oxygen exposure, and thus, in some embodiments the gases may include nitrogen, argon, helium, or some other non-reactive gas, which may be temperature controlled. Additionally, in some embodiments water vapor may be sprayed or delivered to the component, which may increase temperature reduction at exterior surfaces, and which may limit ingress into the component.

Subsequent to the processing, the component may be characterized by material properties that may be enhanced by the present technology, or which may be afforded while limiting exposure of the component to contaminants, as previously described. For example, the process may afford a component characterized by increased hardness and ultimate tensile strength, which may benefit use in a processing chamber. For example, aluminum 6061 components, as well as any number of other materials, produced according to the present technology may be characterized by a Vickers Hardness sufficient to be considered a T4 or T6 temper, and may be characterized by a Vickers Hardness of greater than or about 65, greater than or about 70, greater than or about 75, greater than or about 80, greater than or about 85, greater than or about 90, greater than or about 95, greater than or about 100, greater than or about 105, greater than or about 110, or greater. Similarly, the components may be characterized by an ultimate tensile strength of greater than or about 200 MPa, and may be characterized by an ultimate tensile strength of greater than or about 210 MPa, greater than or about 220 MPa, greater than or about 230 MPa, greater than or about 240 MPa, greater than or about 250 MPa, greater than or about 260 MPa, greater than or about 270 MPa, greater than or about 280 MPa, greater than or about 290 MPa, greater than or about 300 MPa, greater than or about 310 MPa, greater than or about 320 MPa, greater than or about 330 MPa, greater than or about 340 MPa, greater than or about 350 MPa, or more, which may provide improved strength over conventional materials.

Figure 2:
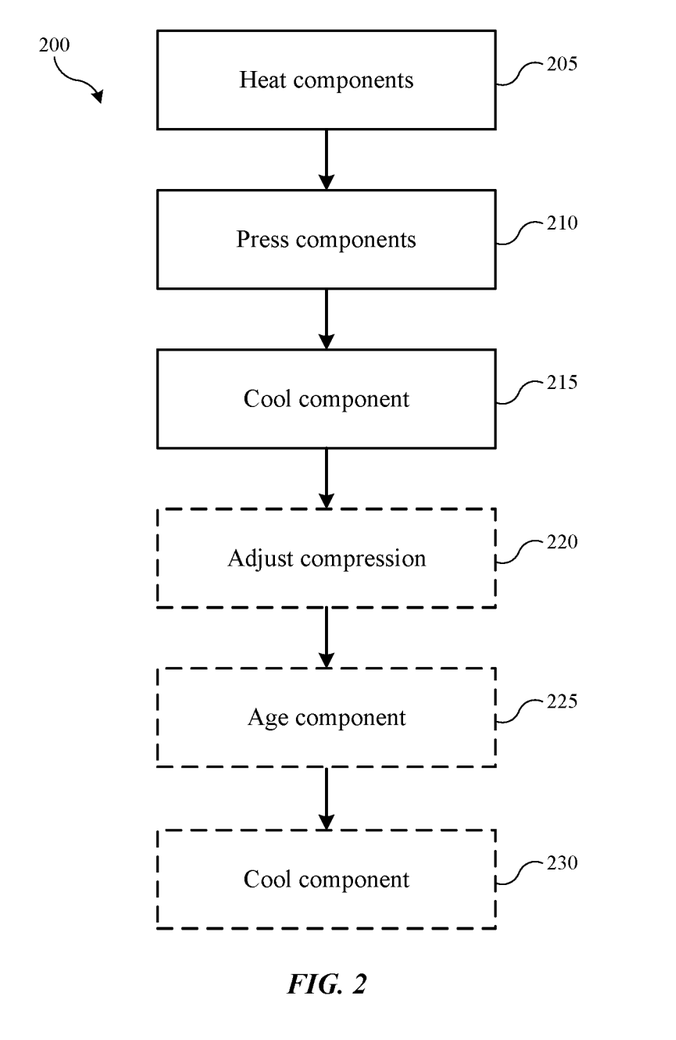
FIG. 2 shows selected operations in a method of cooling a component according to some embodiments of the present technology.

As explained previously, the present technology may be applied to components that have previously been bonded, and which may have lost or reduced material properties. Additionally, the present technology may be applied to perform a quench operation during a diffusion bonding process, which may reduce or limit post-processing operations. FIG. 2 illustrates selected operations in a method 200 of cooling a component according to some embodiments of the present technology. Method 200 may include some or all operations of method 100 described above, and may describe additional details of method 100 in some embodiments. Method 200 may be performed in any chamber as discussed above, and may also be performed in a diffusion bonding chamber, as will be described further below. The method may include a number of optional operations as denoted in the figure, which may or may not be specifically associated with the method according to the present technology. For example, many of the operations are described in order to provide a broader scope of the structural formation, but are not critical to the technology, or may be performed by alternative methodology as one of skill would appreciate is similarly encompassed by the present technology.

Method 200 may include operations of a diffusion bonding process, and may include performing operations on two or more components positioned in the chamber. For example, one or more components may define one or more trenches or channels, and one or more components may define one or more apertures through the component. Subsequent to a bonding operation, the channels and/or apertures may define fluid paths or zones within the component, and/or may produce recesses in which additional components may be seated. At operation 205, the two or more components, which may be any of the components previously described, as well as which may be formed of any of the materials previously discussed, may be heated within a diffusion bonding chamber. The components may be heated to any temperature as previously described. During the heating operation, the components may also be compressed at operation 210. For example, a mechanical press may exert a uniaxial force on the components, which when combined with the heat, may cause the components to produce a solid solution at the interface of the pieces, and which may diffusion bond the components. The press may exert a force from a hundred psi up to thousands of psi, depending on the component, temperature, and materials used. Any of the temperatures and times previously discussed may be utilized in method 200, although in some embodiments the diffusion bonding may occur for less time than a solutionizing operation.

Many conventional diffusion bonding chambers may be limited in a cooling operation that may be performed subsequent to the bonding. For example, conventional diffusion bonding cool-down operations are performed at temperature rates that may be less than or about 10° C./min, which may not provide a quenching operation. Accordingly, pieces of the component, which may have been a T6 temper, for example, may lose the material strength during the diffusion bonding, and the slow cooling may not produce the precipitation within the bonded component that was previously produced in each piece. However, the present technology may cool the component at operation 215, which may be performed in the diffusion bonding chamber. For example, the cooling may include providing a gas into the diffusion bonding chamber, and cooling the substrate, such as previously described in method 100. Any gas may be provided, including any material previously described.

During the cooling operation, the heat may be reduced or halted, although in some embodiments pressure may still be applied to the pieces or bonded component during the cooling. For example, the mechanical press may continue to apply a pressure to the component as it is cooled. The press may be maintained at a constant pressure, although in some embodiments the compression may be adjusted at optional operation 220, such as increased or decreased, during the cooling operation. Because the cooling may cause the component to shrink, for example, the press may adjust the compression to ensure that the bonding is maintained during the cooling operation. The temperature may be reduced to any of the temperatures noted above, and in some embodiments a subsequent aging process may be performed at optional operation 225. For example, while still in the diffusion bonding chamber, or after being transferred to a separate heating chamber, the substrate may be maintained at an aging temperature for a period of time as previously described. The component may then be cooled at optional operation 230 in some embodiments, as previously described. The resulting component may be characterized by any of the material properties previously described, and the process may be completed directly after the diffusion bonding or aging process. This may reduce thermally induced stresses which may affect the component when multiple tempering and bonding operations are performed.

Figure 3A:
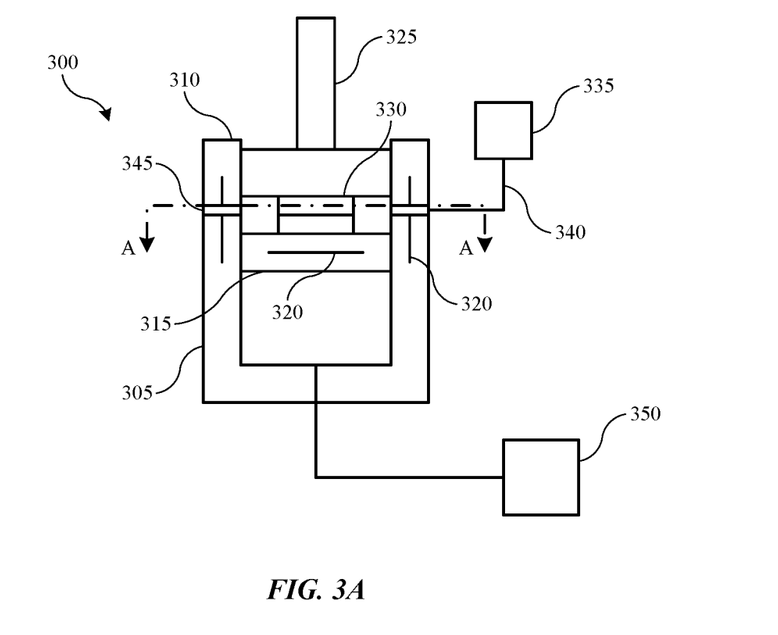
FIG. 3A shows a schematic cross-sectional view of an exemplary diffusion bonding chamber set-up according to some embodiments of the present technology.

Because diffusion bonding chambers may not be equipped to perform gas quenching as previously described, the present technology may include diffusion bonding chambers configured to perform a gas quench in some embodiments. FIG. 3A shows a schematic cross-sectional view of an exemplary diffusion bonding chamber set-up according to some embodiments of the present technology. It is to be understood that the figure is intended to illustrate components included according to the present technology, and which may allow methods as discussed above to be performed. It is also to be understood that any number of modifications may be performed to the schematic representations in commercial embodiments, and which may still be encompassed by the present technology for performing a gas quench in a diffusion bonding chamber.

As illustrated, system 300 may include a diffusion bonding chamber 305, which may be or include a vessel in which a bonding process may be performed. The vessel may include one or more chamber sidewalls 310 defining a volume in which processing may occur. Within the volume may be a substrate support 315, on which components may be diffusion bonded, for example. The chamber may include one or more heaters 320, which may be incorporated in chamber sidewalls or the substrate support as illustrated. The chamber may also be fitted with a mechanical press 325, which may be translated to compress components within the diffusion bonding chamber, and which may be configured to apply a force as previously described. As illustrated, a two-piece component 330 may be positioned on the substrate support 315, and may be bonded to produce a single component within the chamber. Because the vessel may be pressurized during a cooling operation where gas is pumped into the chamber, the press 325 may operate as a seal for the chamber, or may pass through a seal that may hermetically contain the interior volume and allow the volume to be pressurized in some embodiments.

The present technology may also include components or features for providing gas cooling according to any of the methods previously described. For example, system 300 may include a gas delivery system, such as a gas source 335 and one or more fluid lines 340, as well as may include one or more pumps, which may deliver a gas to the diffusion bonding chamber. As illustrated, and as will be described in further detail below, the chamber sidewalls 310 may define one or more gas apertures 345, which may allow gas to be delivered into the diffusion bonding chamber during a cooling operation as discussed above, and which may be fitted with nozzles, for example, which may produce a spray pattern, such as of water vapor. System 300 may also include an exhaust system, which may include a pump 350, and which may allow gas to be pumped from the chamber during a cooling operation, as well as to produce a vacuum environment in some embodiments. Because the gas delivered may be quickly heated by the component, the exhaust system may actively pump the volume of gas being delivered, which may enhance cooling of the component.

Figure 3B:
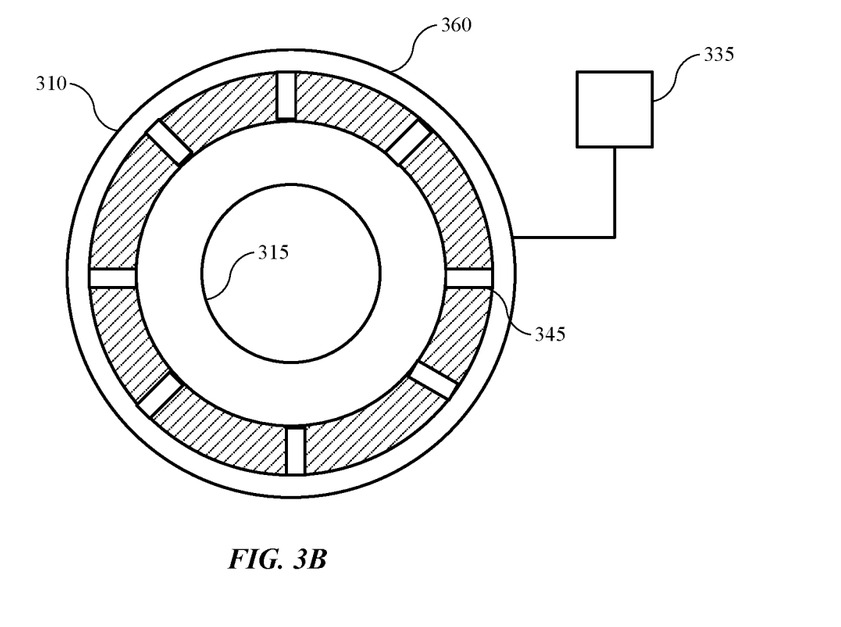
FIG. 3B shows a schematic cross-sectional view of an exemplary diffusion bonding chamber set-up according to some embodiments of the present technology.

FIG. 3B shows a schematic cross-sectional view of an exemplary diffusion bonding chamber set-up according to some embodiments of the present technology, and may illustrate system 300 along line A-A from FIG. 3A. As shown in the cross-section, chamber sidewalls 310 may define a plurality of apertures 345 through the system, and which may allow gas to be delivered at a plurality of locations about the chamber. This may ensure more uniform cooling of the part during the cooling operations described previously. The coupling of gas source 335 to the plurality of apertures may occur in any number of ways, such as with individual couplings, as well as to a single access point on the sidewalls 310 as illustrated. The access point may provide access to a channel 360 extending about a periphery of the chamber, and which may provide fluid access to all gas apertures 345, which may limit system hardware and couplings. A controller may be included to operate the press, heaters, and gas delivery and exhaust systems, which may allow a gas quench to be performed in the diffusion bonding chamber according to any of the methods discussed previously.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where neither of the limits, either limit, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of cooling a semiconductor component substrate, the method comprising:
   heating the semiconductor component substrate to a temperature of greater than or about 500° C. in a chamber for greater than or about 1 hour, wherein the semiconductor component substrate comprises aluminum;
   delivering a gas into the chamber, wherein the gas is characterized by a temperature below or about 100° C.; and
   cooling the semiconductor component substrate only to a temperature between about 100° C. and about 200° C. in a first time period of less than or about 1 minute, wherein, subsequent the cooling, the semiconductor component substrate is characterized by an ultimate tensile strength of greater than or about 320 MPa.

2. The method of cooling a semiconductor component substrate of claim 1, wherein the semiconductor component substrate comprises aluminum 6061.

3. The method of cooling a semiconductor component substrate of claim 2, wherein, subsequent the cooling, the semiconductor component substrate is characterized by a Vicker's hardness of greater than or about 100.

4. The method of cooling a semiconductor component substrate of claim 1, further comprising:
   maintaining the semiconductor component substrate at a temperature between about 150° C. and about 200° C. for a second time period of greater than or about 1 hours.

5. The method of cooling a semiconductor component substrate of claim 4, further comprising:
   subsequent to the second time period, air cooling the semiconductor component substrate.

6. The method of cooling a semiconductor component substrate of claim 1, wherein the semiconductor component substrate comprises a diffusion bonded aluminum substrate.

7. The method of cooling a semiconductor component substrate of claim 6, wherein the diffusion bonded aluminum substrate defines one or more internal channels accessible through aperture defined in the diffusion bonded aluminum substrate.

8. The method of cooling a semiconductor component substrate of claim 1, wherein the gas comprises air, water vapor, nitrogen, or argon.

9. The method of cooling a semiconductor component substrate of claim 1, wherein the chamber comprises a heater and a support for the semiconductor component substrate, and wherein a plurality of gas apertures are defined about the support.

10. The method of cooling a semiconductor component substrate of claim 1, wherein the chamber is a diffusion bonding chamber.

11. The method of cooling a semiconductor component substrate of claim 1, wherein the semiconductor component substrate is heated to greater than or about 540° C. in the chamber.

12. The method of cooling a semiconductor component substrate of claim 1, wherein, subsequent the cooling, the semiconductor component substrate is characterized by an ultimate tensile strength of greater than or about 350 MPa.

13. A method of cooling a semiconductor component substrate, the method comprising:
   heating the semiconductor component substrate to a temperature of greater than or about 500° C. in a diffusion bonding chamber while applying a uniaxial force against the semiconductor component substrate, wherein the semiconductor component substrate comprises a first aluminum piece and a second aluminum piece;
   delivering a gas into the diffusion bonding chamber, wherein the gas is characterized by a temperature below or about 100° C.; and
   cooling the semiconductor component substrate to a temperature between about 100° C. and about 200° C. in a first time period of less than or about 1 minute.

14. The method of cooling a semiconductor component substrate of claim 13, further comprising:
   maintaining the semiconductor component substrate at a temperature between about 150° C. and about 200° C. for a second time period of greater than or about 1 hours.

15. The method of cooling a semiconductor component substrate of claim 14, further comprising:
   subsequent to the second time period, air cooling the semiconductor component substrate.

16. The method of cooling a semiconductor component substrate of claim 13, wherein the diffusion bonding chamber comprises a heater, a support for the semiconductor component substrate, and a mechanical press, and wherein a plurality of gas apertures are defined about the support.

17. The method of cooling a semiconductor component substrate of claim 16, wherein the diffusion bonding chamber comprises an exhaust system configured to maintain fluid flow through the diffusion bonding chamber while delivering a gas into the diffusion bonding chamber.

18. The method of cooling a semiconductor component substrate of claim 13, wherein the first aluminum piece defines one or more channels, and wherein the second aluminum piece defines one or more apertures.

19. The method of cooling a semiconductor component substrate of claim 13, wherein each of the first aluminum piece and the second aluminum piece comprise aluminum 6061.

20. A method of cooling a semiconductor component substrate, the method comprising:
   heating the semiconductor component substrate to a temperature of greater than or about 500° C. in a chamber for greater than or about 1 hour, wherein the semiconductor component substrate comprises aluminum;
   delivering a gas into the chamber, wherein the gas is characterized by a temperature below or about 100° C.;
   cooling the semiconductor component substrate to a temperature below or about 200° C. in a first time period of less than or about 1 minute, wherein, subsequent the cooling, the semiconductor component substrate is characterized by an ultimate tensile strength of greater than or about 320 MPa; and
   directly after cooling, maintaining the semiconductor component substrate at a temperature between about 150° C. and about 200° C. for a second time period of greater than or about 1 hours.

* * * * *